United States Patent [19]
Houston et al.

[11] Patent Number: 5,943,258
[45] Date of Patent: Aug. 24, 1999

[54] MEMORY WITH STORAGE CELLS HAVING SOI DRIVE AND ACCESS TRANSISTORS WITH TIED FLOATING BODY CONNECTIONS

[75] Inventors: Theodore W. Houston, Richardson; Patrick W. Bosshart, Plano, both of Tex.

[73] Assignee: Texas Instruments Incorporated, Dallas, Tex.

[21] Appl. No.: 08/998,153

[22] Filed: Dec. 24, 1997

[51] Int. Cl.⁶ .................................................. G11C 11/00
[52] U.S. Cl. ........................ 365/165; 365/154; 365/176; 365/216
[58] Field of Search ................................. 365/165, 154, 365/176, 188, 189.09, 214

[56] References Cited

U.S. PATENT DOCUMENTS 5,515,313  5/1996  Yamaguchi .............................. 365/154
5,706,226  1/1998  Chan et al. ............................. 365/154

OTHER PUBLICATIONS

J.A. Mandelman, F. Assaderaghi, and L.L. Hsu; "SOI MOSFET Mismatch Due to Floating–Body Effects", pp. 164–165 of 1997 *IEEE International SOI Conference Proceedings*, dated Oct. 6–9, 1997.

*Primary Examiner*—Vu A. Le
*Attorney, Agent, or Firm*—Robby T. Holland; Carlton H. Hoel; Richard L. Donaldson

[57] ABSTRACT

An integrated circuit (10). The integrated circuit comprises a first SOI transistor (AT3) having a body and for performing first function. The integrated circuit further comprises a second SOI transistor (DT3) having a body and for performing a second function different than the first function. Lastly, the integrated circuit comprises a conductor (BT1) connecting the body of the first SOI transistor to the body of the second SOI transistor such that the bodies of the first SOI transistor and the second SOI transistor float together.

28 Claims, 5 Drawing Sheets

MEMORY WITH STORAGE CELLS HAVING SOI DRIVE AND ACCESS TRANSISTORS WITH TIED FLOATING BODY CONNECTIONS

CROSS-REFERENCES TO RELATED APPLICATIONS

Not Applicable.

STATEMENT REGARDING FEDERALLY SPONSORED RESEARCH OR DEVELOPMENT

Not Applicable.

BACKGROUND OF THE INVENTION

The present embodiments relate to transistor circuits, and are more particularly directed to a memory with storage cells having silicon-on-insulator ("SOI") drive and access transistors with tied floating body connections.

The technology of many modern circuit applications continues to advance at a rapid pace, with one incredibly prolific type of circuit, and one which is highly developed, being digital memory. For such memories, consideration is given to all aspects of design, including maximizing efficiency and increasing performance. These considerations may be further evaluated based on the integrated circuit device in which the memory is formed, where such circuits may be implemented either as stand-alone products, or as part of a larger circuit such as a microprocessor. One often critical factor with respect to digital memories is the cost of the device and this cost is often affected by the overall size of the memory architecture. Another factor with respect to digital memories includes noise immunity. Thus, a desirable memory reduces device size and provides an acceptable immunity to noise signals.

In the current art, memory size may be affected by various factors. In one prior art approach as detailed later, memory size is affected by connections used for each of the drive and access transistors in each of the memory cells of the configuration. Specifically, it is known in the memory art for each memory cell to often include at least two access transistors, where access is through those transistors to corresponding storage nodes of the cell. It is further known to often include at least two drive transistors, where those transistors provide the ability to drive an output node through an access transistor, according to the state of the memory cell. In both cases, under current memory architectures these two types of transistors are sometimes formed using silicon-on-insulator (SOI) technology. In this instance, it is common to tie the body of each of the access and drive transistors to a fixed and relatively low potential. For example, often the bodies of the access transistors are tied to ground, while often the bodies of the drive transistors are tied to the source of the drive transistors, where the source itself is connected to ground. These connections are performed in the prior art so that the body of each transistor is fixed to a known potential, rather than permitting the body potential to fluctuate which could otherwise occur due to the tendency of the body potential to deviate due to the signal conditions experienced by the transistor. While these body-to-ground connections therefore provide acceptable operational performance, they also provide a drawback in that they require an additional connection per transistor and, thus, consume additional area on the integrated circuit in which the memory configuration is formed.

The above considerations and drawbacks are presented in more detailed fashion below. Based on that presentation, one skilled in the art will appreciate that there is a need to address these drawbacks. The preferred embodiments described below do indeed address these drawbacks, and thereby provide a more efficient and desirable integrated circuit configuration.

BRIEF SUMMARY OF THE INVENTION

In one preferred embodiment, there is an integrated circuit. The integrated circuit comprises a first SOI transistor having a body and for performing first function. The integrated circuit further comprises a second SOI transistor having a body and for performing a second function different than the first function. Lastly, the integrated circuit comprises a conductor connecting the body of the first SOI transistor to the body of the second SOI transistor such that the bodies of the first SOI transistor and the second SOI transistor float together.

In another embodiment, there is an integrated circuit memory array, wherein the memory array further comprises a first bitline and a plurality of memory storage cells. Each of the plurality of memory cells further comprises a first SOI access transistor and a first SOI drive transistor, where each of these transistors comprises a plurality of nodes, the plurality of nodes comprising a first source/drain, a second source/drain, a gate for receiving a potential to enable a conductive path between the first source/drain and the second source/drain, and a body terminal coupled to a body region disposed between the first source/drain and the second source/drain. For each of the memory cells, the first source/drain of the first SOI access transistor is coupled to the first bitline, and the first source/drain of the first SOI drive transistor is coupled to the second source/drain of the first SOI access transistor. Also for each of the cells, there is further included a body connection coupling the body of the first SOI access transistor to the body of the first SOI drive transistor such that the bodies of the first SOI access transistor and the first SOI drive transistor are connected to float together. Other circuits, systems, and methods are also disclosed and claimed.

BRIEF DESCRIPTION OF THE SEVERAL VIEWS OF THE DRAWING

FIG. 1b illustrates a prior art schematic of a 6T memory cell circuit which may be used for each of the storage cells in FIG. 1a;

FIG. 2b illustrates various diode and capacitor effects of the configuration of the SOI transistor of FIG. 2a;

DETAILED DESCRIPTION OF THE INVENTION

As an introduction before proceeding with a detailed discussion of the preferred inventive embodiments, FIGS. 1a through 2b as well as the following discussion present an explanation of a prior art integrated circuit 10 including a memory configuration 20, concluding with some observations about prior art drawbacks as improved upon by the preferred embodiments. Integrated circuit 10 is typical of that in the art and, thus, includes components formed using a semiconductor substrate and various layers formed above that substrate. In the present example, integrated circuit 10 implements silicon-on-insulator ("SOI") technology. As known in the art, therefore, an insulator layer (typically silicon dioxide) is formed over the entire semiconductor substrate, and various devices are then formed over this insulator. To form these additional devices, a layer of silicon is placed over the insulator, thereby giving rise to the SOI name. Moreover, this silicon layer is then appropriately etched and doped to form various desired devices. To better appreciate these principles for the example of memory configuration 20, the layout of an SOI transistor is discussed below in connection with FIG. 2a. Before reaching that discussion, however, certain schematic details are first addressed in the context of FIGS. 1a and 1b.

Figure 1A:
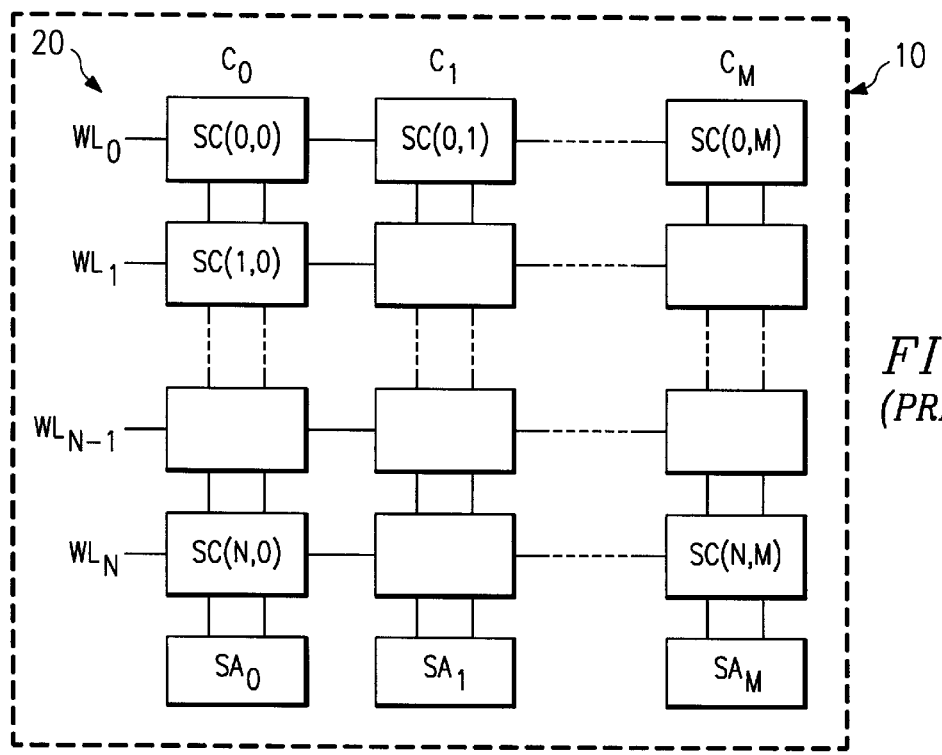
FIG. 1a illustrates a prior art integrated circuit including a memory configuration formed in an array fashion and having a plurality of memory storage cells.

Looking in detail to FIG. 1a, it illustrates a prior art memory configuration 20 generally in a combined block and schematic form. Memory configuration 20 is generally connected in an array form, thereby presenting a number of wordlines $WL_0$ through $WL_N$ each aligned in the x-dimension and a number of columns $C_0$ through $C_M$ each aligned in the y-dimension. At the intersection of each wordline and column is a storage cell abbreviated SC, and some of which are shown by way of example as having a coordinate (WL,C) such that the first element specifies the wordline corresponding to the storage cell and the second element specifies the column corresponding to the storage cell. The array nature of memory configuration 20 permits either writing data to, or reading data from, a storage cell on a wordline basis. In other words, one or more storage cells along the same wordline may be accessed (i.e., for either read or write) at a time.

Memory configuration 20 is representative of a static random access memory (SRAM) and, consequently, for each column a pair of conductors extends between storage cells along the column, where these conductors are referred to in the art as bitlines. The bitlines permit either reading or writing of a cell connected to a given pair of bitlines, as introduced generally here and as detailed further in connection with FIG. 1b, below. Turning first to an introduction of these operations, for purposes of writing data to the cell, one of the two bitlines is pulled down with some external write circuit (not shown), and then the wordline of the cell is asserted to write the data state to the cell in response to the pulled down bitline. For purposes of reading data from the cell, the two bitlines for a given cell provide two respective signals which are compared to one another to determine the data stored at a cell along a selected one of the wordlines. More specifically, the signals provided by each bitline pair in FIG. 1a are connected to corresponding sense amplifier circuits, shown as $SA_0$ through $SA_M$. For purposes of discussion, the subscript of each of the sense amplifier circuits matches that of the column to which it corresponds. Each of sense amplifier circuits $SA_0$ through $SA_M$ includes circuitry for "sensing" the differential voltage along the paired bitlines by amplifying it. Typically, the differential voltage is either amplified to a full scale signal, or there may be stages which amplify the current drive to some level having a lesser signal swing then a full scale signal. This signal may then be used either by other circuitry, either internally on integrated circuit 10 or external from that device. Note also that FIG. 1a illustrates each sense amplifier circuit as connected only to a single pair of corresponding column conductors by way of example, whereas other variations may exist in the correlation between column conductors and sense amplifier circuits. In other words, as an alternative to that shown in FIG. 1a, an embodiment may be created where more than two bitlines are connected by some multiplexing functionality to a single sense amplifier circuit; thus, one pair of these bitlines may then be selected at a time to provide a differential signal to the sense amplifier circuit.

Figure 1B:
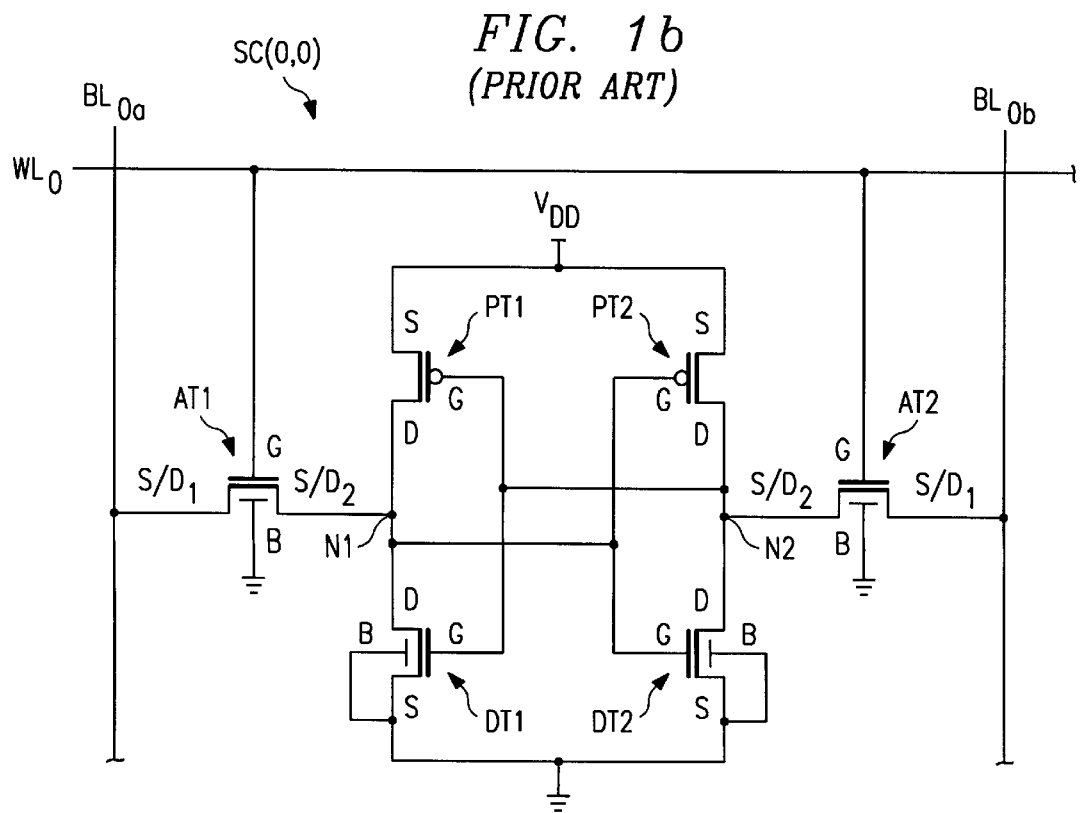

FIG. 1b illustrates a schematic of prior art storage cell SC(0,0) in greater detail, with it understood that each of the remaining storage cells of FIG. 1a is constructed in the same manner (yet, of course, connected to a different one of either a wordline or pair of bitlines, or both). At the outset, note for further discussion that the bitlines from column 0 of FIG. 1a are designated in FIG. 1b with the abbreviation "$BL_0$", and are further distinguished from one another by adding one of the letters "a" and "b" to the subscripts for these conductors. Storage cell SC(0,0) is what is referred to in the art as a 6T cell, meaning it includes six transistors. For purposes of presenting a basis for a functional description below, each of these transistors is further referred to by combining the word "transistor" with a descriptive term relating to the function of the transistor. In this regard, storage cell SC(0,0) includes two access transistors AT1 and AT2, two pull-up transistors PT1 and PT2, and two drive transistors DT1 and DT2. Note that the functional terms "access" and "drive" are chosen to facilitate an understanding by one skilled in the art but not by way of limitation, as other terms are also sometimes used in the art for such transistors. For example, the access transistor are sometimes referred to as passgate transistors. As another example, the drive transistors are sometimes referred to as pull-down transistors. In any event, from the additional details including the connection and function of each of these transistors as provided below, one skilled in the art will appreciate those transistors which are the subject of the present inventive embodiments, regardless of the particular terminology directed to such transistors.

Turning first to the two access transistors AT1 and AT2, both are n-channel transistors and are connected in a symmetric manner. Accordingly, the following discussion first addresses access transistor AT1 followed by a brief discussion of the similar nature of access transistor AT2. The gate of access transistor AT1 is connected to wordline $WL_0$. As a transistor, access transistor AT1 has two typically symmetric regions which are commonly characterized as source and drain regions. Specifically, often for a transistor, one of these regions is referred to as the source while the other is the drain, based on the relative potentials connected to those regions. However, in an implementation such as storage cell SC(0,0), the potential at either region may swing relative to the other and, thus, a given region may in one instance be considered the source while in another instance may be considered the drain. For this reason, from this point forward and also for the remaining comparable transistors discussed in this document each region is referred to as a source/drain. Given that convention, access transistor AT1 has two source/drains $S/D_1$ and $S/D_2$. Source/drain $S/D_1$ is connected to bitline $BL_{0a}$ and source/drain $S/D_2$ is connected to a node N1. Looking now to access transistor AT2, its gate is also connected to wordline $WL_0$. A first source/drain $S/D_1$ of access transistor AT2 is connected to bitline $BL_{0b}$ while a second source/drain $S/D_2$ of access transistor AT2 is connected to a node N2. Lastly and of key note for purposes of appreciating the preferred embodiments described later, note that for both access transistors AT1 and AT2, the body of each is connected to ground. This connection is fairly typical in the SOI art, and is typically done to ensure that the body of the SOI transistor is connected to some known potential to avoid capacitive and other effects described later. As an alternative in the prior art, the bodies of access transistors AT1 and AT2 may be left floating.

Looking now to pull-up transistors PT1 and PT2, both are p-channel transistors and connected in a symmetric manner. Turning first to pull-up transistor PT1, its source is connected to a relatively high voltage, which is shown as $V_{DD}$ as is customary in the transistor art. The drain of pull-up transistor PT1 is connected to node N1. Lastly, the gate of pull-up transistor PT1 is connected to two other points. First, the gate is connected to the gate of drive transistor DT1. Second, the gate is connected to node N2. Looking now to pull-up transistor PT2, its source is connected to $V_{DD}$ and its drain is connected to node N2. The gate of pull-up transistor PT2 is connected to the gate of drive transistor DT2 and to node N1. In the prior art, the bodies of pull-up transistors PT1 and PT2 are left floating, as illustrated in FIG. 1b, or are connected to the sources of pull-up transistors PT1 and PT2, respectively, and hence to $V_{DD}$.

With reference to drive transistors DT1 and DT2, both are n-channel transistors and also are connected in a symmetric manner. Turning first to drive transistor DT1, its source is connected to ground and its drain is connected to node N1. The gate of drive transistor DT1, as mentioned above, is connected to the gate of pull-up transistor PT1 and to node N2. Lastly, as introduced in the Background Of The Invention section of this document, the body of drive transistor DT1 is connected to the source of drive transistor DT1 (and, hence, to ground). This body connection (as well as that of drive transistor DT2 described below) is also noteworthy as distinguishable for appreciating the preferred embodiments described later, and again is common in the SOI art to ensure that the body of the SOI transistor is connected to some known potential for avoiding capacitive and other effects described later. Looking now to drive transistor DT2, its source is connected to ground and its drain is connected to node N2. The gate of drive transistor DT2 is connected to the gate of pull-up transistor PT2 and to node N1, and the body of drive transistor DT2 is connected to the source of drive transistor DT2 (and, hence, to ground). As an alternative in the prior art, the bodes of drive transistors DT1 and DT2 may be left floating.

In operation, a binary value may be either written to, or read from, storage cell SC(0,0). When power is first applied to storage cell SC(0,0), it will assume one of two binary states, with the state being understood as random at this initial point of operation. The cases of either a subsequent write of data to storage cell SC(0,0), or a read from storage cell SC(0,0), are each discussed separately below.

A write to storage cell SC(0,0) is as follows. First, one of bitlines $BL_{0a}$ and $BL_{0b}$ is pulled low by some write circuit (not shown) while the other remains high. For an example, assume that bitline $BL_{0a}$ is pulled low and, thus, bitline $BL_{0b}$ remains high. Next, wordline $WL_0$ is asserted high which enables access transistors AT1 and AT2 by placing the high signal at the gates of those transistors; in this regard, note that the term "enable" is intended as known in the art to indicate that a sufficient source-to-gate potential is provided such that the transistor channel fully conducts. Additionally, although other storage cells are not shown in FIG. 1b, note that other cells which likewise have access transistors connected to wordline $WL_0$ are concurrently enabled for writing due to the enabling signal on wordline $WL_0$. Returning to storage cell SC(0,0), the enabling of access transistor AT1 connects node N1 to the low potential at bitline $BL_{0a}$. Due to the relative current drive capabilities of the transistors of storage cell SC(0,0) as further detailed below, bitline $BL_{0a}$ pulls node N1 low. With node N1 low, pull-up transistor PT2 is enabled and drive transistor DT2 is disabled, thereby bringing node N2 to $V_{DD}$, which is further connected to the gate of drive transistor DT1 and, therefore, enables drive transistor DT1. Since drive transistor DT1 is enabled, node N1 continues to be pulled to ground and, thus, maintains node N1 at ground even after wordline $WL_0$ is no longer enabling to access transistors AT1 and AT2. Consequently, storage cell SC(0,0) will maintain the stored data state until it is thereafter changed bib a subsequent write operation.

A read from storage cell SC(0,0) is as follows. At the outset, for the sake of the following example, assume that the following read occurs after the above-described write and, thus, node N1 is maintained low while node N2 is maintained high. Turning to the read operation, first both bitlines $BL_{0a}$ and $BL_{0b}$ are precharged high. Second, wordline $WL_0$ is enabled, once again enabling access transistors AT1 and AT2. Next, and again due to the differing drive current capabilities of the cell transistors as detailed below, the low signal at node N1 is effectively transferred to $BL_{0a}$; more particularly, the combination of the enabled access transistor AT1 and the enabled drive transistor DT1 pulls the precharged voltage of bitline $BL_{0a}$ low. At the same time, however, the precharged voltage at bitline $BL_{0b}$ is not disturbed. Consequently, sense amplifier $SA_0$ (see FIG. 1a) next amplifies the differential voltage between bitlines $BL_{0a}$ and $BL_{0b}$, thereby providing a voltage which based on the relative values between those bitlines represents a binary state for storage cell SC(0,0).

Having now described both the write and read operations with respect to storage cell SC(0,0), recall that for both operations it was mentioned that the drive current capabilities of the transistors in the cell are relevant to ensure proper operation. More specifically, note that proper operation is obtained by the following relative order of drive current capability for the transistors in storage cell SC(0,0):

drive current(DT)>drive current(AT)>drive current(PT)

The above demonstrates, therefore, that the drive current capability of the drive transistors is larger than the drive current capability of the access transistors, and the drive current capability of the access transistors is larger than the drive current capability of the pull-up transistors. Given this ordering, note the following two observations by way of introduction, and as detailed later. As a first observation, note that the drive current of a transistor may be affected by various factors, such as the conductivity type of the transistor, its size, and lastly as detailed later, its threshold voltage. As a second observation, note that given the above order, proper operation occurs because a high bitline may be pulled low through a corresponding enabled access transistor AT1 or AT2, but a high charge on a bitline cannot pull, through the corresponding access transistor AT1 or AT2, a low node N1 or N2 high. This latter point is illustrated through an example below.

To demonstrate the effect of the drive current order depicted above as well as the effect if that order is violated, assume as an example that the above order is disturbed such that the drive current of the cell's access transistors are too high relative to the drive current of the cells drive transistors. Given this assumption, note the possibility of erroneous operation during a read operation. Specifically, recall for a proper read operation that both bitlines are precharged high, and one is subsequently pulled low through a corresponding access transistor based on the corresponding low node N1 or N2. However, if the current drive capability of the access transistor is relatively high, then once the access transistors are enabled by the wordline then the low node N1 or N2 may be mistakenly pulled high, rather than the bitline being pulled low as intended. Consequently, both nodes N1 and N2 would be high at that point, potentially upsetting the information stored in the cell. Other examples of the effect of the above current drive ordering will be appreciated by one skilled in the art.

As introduced briefly above, one factor influencing a transistor's current drive capability is its threshold voltage. Thus, to maintain the desired relative current drives of the transistors described above, it is also desirable to consider the effects of each transistor's threshold voltage. Further complicating this consideration for an SOI transistor is that the transistor threshold voltage is affected by the potential connected to the body of the transistor, and for a completely floating body, this potential may change over time, particularly due to the various diode and capacitive effects which arise from the structure of the device. Concluding, therefore, floating body effects can influence the transistor threshold voltage, which can influence the transistor drive capability and thereby influence the desired relative ordering set forth above. This conclusion is further appreciated from the following detailed examination of an SOI transistor as well as the prior art treatment of these considerations.

Figure 2A:
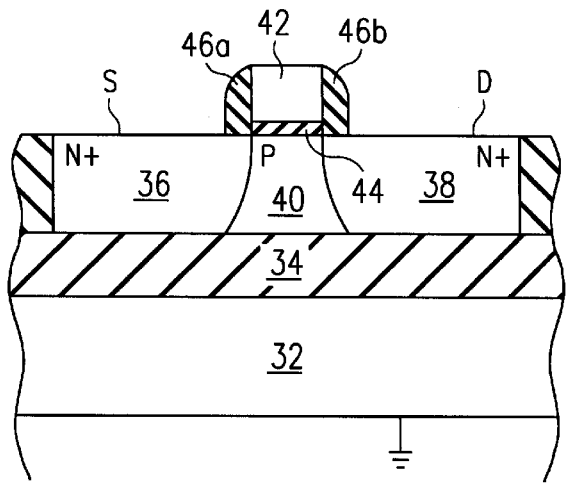
FIG. 2a illustrates a cross-sectional view of the semiconductor fabrication of a silicon-on-insulator (SOI) transistor.

FIG. 2a illustrates a cross-sectional view of a prior art SOI transistor designated generally at 30 and, thus, of the type which may be used to form each of the transistors in FIG. 1b. Starting at the bottom of the Figure, transistor 30 includes a semiconductor substrate 32 which is a layer of P type semiconductor and is typically connected to ground. As the SOI name suggests, an insulating layer 34 is formed over substrate 32. Overlying insulating layer 34 are various regions which give rise to the various pn junctions and gate operation of the device. Specifically, two N+ regions 36 and 38 are formed over insulating layer, where one of these regions operates as the source of transistor 30 while the other operates as its drain. For purposes of the remaining discussion, assume that N+ region 36 is the transistor source and N+ region 38 is the transistor drain. Between regions 36 and 38 is the body 40 of the device, which is formed by a P semiconductor region. A gate 42 is formed over body region 40, with a gate insulator 44 formed between gate 42 and body 40. Lastly, insulating sidewalls 46a and 46b are formed on the sides of gate 42.

Having set forth the various parts of transistor 30, reference is now directed to the general operation of the device as well as various of its electrical attributes. Specifically, one skilled in the art will readily acknowledge a positive gate-to-source voltage as applied to transistor 30 permits electrical charge to conduct between regions 36 and 38, by way of a charge path formed in body 40. However, note now some additional observations which arise from the various interfaces between the parts of transistor 30, as further illustrated schematically in FIG. 2b. First, note that the structure of transistor 30 gives rise to four capacitive interfaces, shown as capacitors C1 through C4 in FIG. 2b. Two of these capacitors, namely C1 and C2, are formed between body 40 and regions 36 and 38 due to the charge layer which forms in body 40 during the operation of transistor 30. A third capacitor, C3, exists between gate 42 and body 40 (i.e., due to gate insulator 44). Finally, a fourth capacitor, C4, exists between body 40 and substrate 32 (i.e., due to insulator layer 34). Second, note that the structure of transistor 30 gives rise to two diodes (i.e., pn junctions), the first being between shown in FIG. 2b as diode D1 between body 40 and region 36, and the second being shown as diode D2 between body 40 and region 38.

Figure 2B:
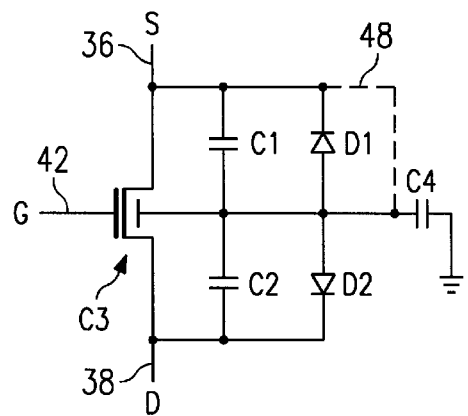

Given the illustrations of FIGS. 2a and 2b, attention is now directed to the possible effects of various of the above-introduced capacitors and diodes. To better appreciate these effects, consider the possible consequences if the body of a single SOI transistor is not connected to a fixed potential (i.e., the body is left floating). Particularly, assume over time that the transistor is enabled in numerous instances. In other words, during each of these instances the gate-to-source voltage is positive. As a result, the body voltage will tend toward the source voltage due to diode D1. However, if the body voltage moves more positive, then there may be conduction through diode D1 while if the body voltage moves more negative, then there may be reverse leakage current across that diode. As another observation, note further that if body 40 floats, then due to the various capacitances a change in any of the voltages at any of the source, drain, or gate, will tend to pull the body voltage in the same direction as the change in source, drain, or gate voltage. Concluding, therefore, one skilled in the art will appreciate that the body voltage, and hence the threshold voltage of the SOI transistor, will fluctuate in response to the recent signal history of the device.

Having understood the above, note now the prior art manner of responding to the above considerations by tying the body to a fixed voltage such as the source of the transistor as is done for drive transistors DT1 and DT2. To appreciate this effect, note that FIG. 2b further illustrates a connection 48 shown in phantom, where that connection actually exists when the body is tied to the source of the SOI transistor. Given connection 48, note that it effectively short circuits any effect of capacitor C1 and diode D1. Thus, various of the tendencies of the body voltage described above are removed by connection 48. In addition (or as an alternative for access transistors AT1 and AT2), if the source of the device is connected to a known potential (e.g., ground), then the body potential is likewise fixed by connection 48 and thus is not influenced by other potentials as well (e.g., a potential as applied to gate 42 or drain region 38). Given these effects, it now should be appreciated why the prior art emphasizes connecting the transistor body to the transistor source (and/or to ground) as is the case for various schemes including that of memory configuration 20 of FIGS. 1a and 1b, especially where matching of transistor threshold voltages is important.

As a final consideration for purposes of later comparison to the preferred embodiment, note that the semiconductor layout implementation of FIG. 1b requires consideration for each of the body connections of access transistors AT1 and AT2 as well as the body connections of drive transistors DT1 and DT2. For example, these four connections will affect the possible shape of the layout. As another example, each of the four different connections will require area on the integrated circuit. As appreciated below, the preferred embodiment simplifies this consideration.

Figure 3:
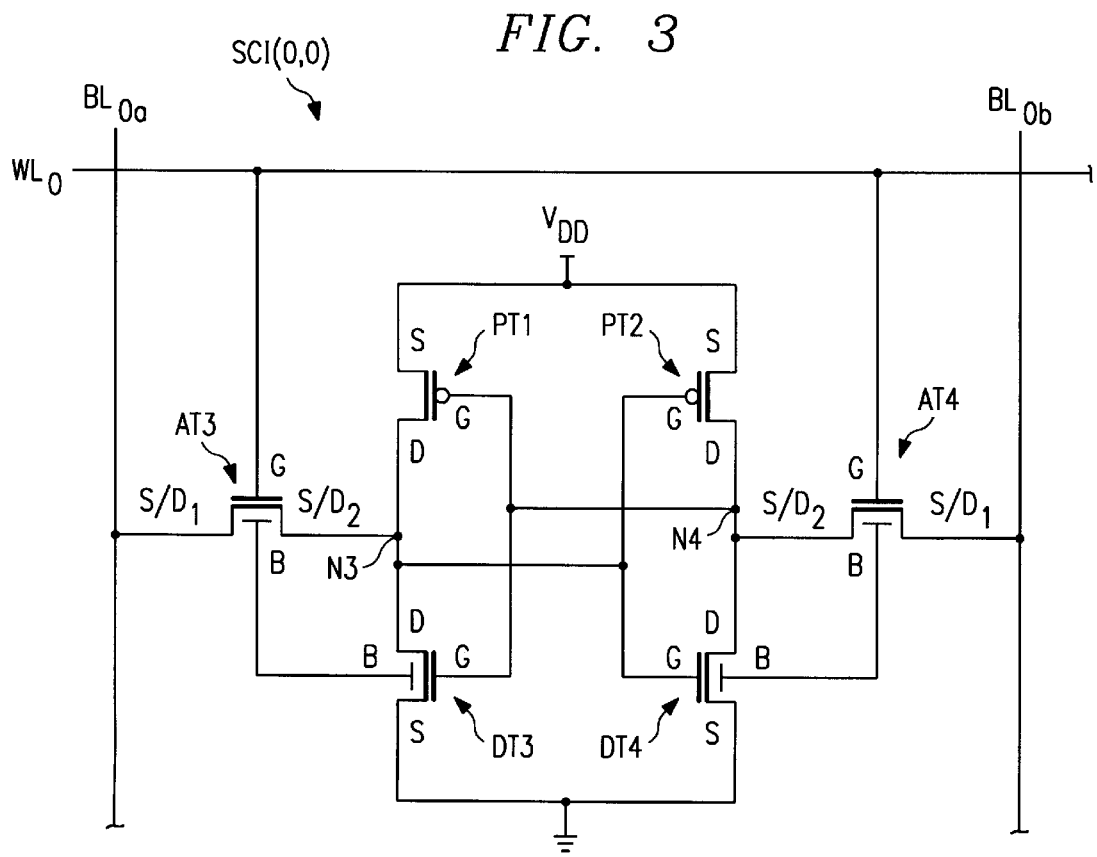
FIG. 3 illustrates a schematic of a memory cell in accordance with the present inventive embodiments.

FIG. 3 illustrates a schematic of a storage cell SCI(0,0) in accordance with the present inventive embodiments and, more particularly, as a substitute for storage cell SC(0,0) as shown in FIG. 1b. For sake of providing a distinction in the reference indicators, note that an "I" is added to the designation of the storage cell circuit of FIG. 3 to generally distinguish it from the storage cell of FIG. 1b. However, it should be understood that other than the schematic and layout considerations presented below, it is intended for the present inventive embodiments that a memory configuration may be constructed in the same manner as shown in FIG. 1a, but substituting a storage cell of the type shown by storage cell SCI(0,0) in place of each of the storage cells shown in FIG. 1a. Thus, the preferred embodiments contemplate an integrated circuit with storage cells consistent with the discussion below and configured in a general sense as a memory configuration such as configuration 20. Moreover, the integrated circuit including such a memory configuration 20 may be of various different types, including but not limited to a stand alone memory integrated circuit, an application specific integrated circuit, a digital signal processor, or a microprocessor. Moreover, the integrated circuit may be constructed using semiconductor fabrication principles ascertainable by one skilled in the art, with certain aspects of the present inventive embodiments arising from the connections and layout considerations as appreciated from the following discussion.

Turning now to the details of storage cell SCI(0,0) of FIG. 3, it is first instructive to review the similarities between it and the prior art. In this regard, storage cell SCI(0,0) includes six transistors connected as a 6T cell with pull-up transistors PT1 and PT2 remaining unchanged. Each of the pull-up transistors has its source connected to $V_{DD}$ and its drain connected to a corresponding node N3 or N4. The remaining four transistors of storage cell SCI(0,0) are connected in certain respects in a different manner than in the prior art; thus, to distinguish them from those discussed earlier, in FIG. 3 the access transistors are labeled AT3 and AT4 and the drive transistors are labeled DT3 and DT4. The differences in connections of these four transistors are detailed later. Returning first to the similarity of storage cells SC(0,0) and SCI(0,0) and, more particularly with respect to the pull-up transistors, the gate of pull-up transistor PT1 is connected to the gate of drive transistor DT3, and further to node N4. Similarly, the gate of pull-up transistor PT2 is connected to the gate of drive transistor DT4, and further to node N3. Looking at the commonality of storage cells SC(0,0) and SCI(0,0) with respect to the access transistors, access transistor AT3 has a first source/drain $S/D_1$ connected to bitline $BL_{0a}$ and a second source/drain $S/D_2$ connected to node N3. Similarly, access transistor AT4 has a first source/drain $S/D_1$ connected to bitline $BL_{0b}$ and a second source/drain $S/D_2$ connected to node N4. The gates of both access transistors AT3 and AT4 are connected to wordline $WL_0$. Looking at the commonality of storage cells SC(0,0) and SCI(0,0) with respect to the drive transistors, the drain of drive transistor DT3 is connected to node N3 and, as introduced above, its gate is connected to the gate of pull-up transistor PT1 as well as to node N4. Similarly, the drain of drive transistor DT4 is connected to node N4 and its gate is connected to the gate of pull-up transistor PT2 as well as to node N3. Lastly, the sources of both drive transistors DT3 and DT4 are connected to ground.

A key distinction of the preferred embodiment as shown in storage cell SCI(0,0) and its prior art counterpart described earlier arises from the body connections of the access and drive transistors of that cell. With respect to access transistors AT3 and AT4, note that their bodies are not connected to ground. With respect to drive transistors DT3 and DT4, note that their bodies are not connected to the respective source of each of those transistors. Instead of the above prior art connections, note that the body of each access transistor is connected to the body of a corresponding drive transistor, where it is stated that the transistors are corresponding to indicate that they are related in the sense that when both are concurrently enabled during a read operation, they form a series path through which the potential on a bitline (e.g. high) may be pulled to a different potential (e.g., low). For example, if node N3 is low and a read operation is performed, then it is the desired operation for the storage cell that once access transistor AT3 is enabled, bitline $BL_{0a}$ is pulled low through access transistor AT3, by the conduction of the corresponding drive transistor DT3. In this respect, access transistor AT3 corresponds to drive transistor DT3. Similarly, if node N4 is low and a read operation is performed, then it is the desired operation for the storage cell that once access transistor AT4 is enabled, bitline $BL_{0b}$ is pulled through access transistor AT4, by the conduction of the corresponding drive transistor DT4. In this respect, access transistor AT4 corresponds to drive transistor DT4. Lastly, given the observed mutual body connections set forth above, note with respect to each that while the bodies of corresponding access and drive transistors are connected to one another, they are note connected to a node which has a fixed voltage associated with it (e.g., a transistor source or a fixed potential node). In other words, the bodies of corresponding access and drive transistors are connected in such a manner that they float. Of course, since the two bodies are connected to one another, each generally stores the same voltage as the other, that is, they float together.

Given that the bodies of each pair of corresponding access and drive transistors float, initially it is noted that this is against the teachings of the prior art which tend toward connecting the bodies to a known voltage. However, note that the present inventive embodiment still provides effective operation in the context of the storage and read/write operations of a storage cell. Specifically, part of the purpose of each corresponding access and drive transistor pair is to permit a read operation whereby a low node pulls down a precharged bitline. If the bodies of corresponding access and drive transistor pair were permitted to float independently of one another, then the recent signal conditions as to one of these transistors may affect its threshold voltage in a manner which would create an imbalance as to the other transistor if it were not affected in the same way. As discussed earlier, a change in a threshold voltage may then affect the drive current capability of the transistor and, thus, an insufficient relative difference may exist between the drive current capabilities of an access transistor with respect to a corresponding drive transistor. Such a change may arise from past signal history or signal noise associated with the circuit. In any event, such an event may upset the cell's state on an attempted read operation. However, in contrast, the tying of the bodies together as shown in FIG. 3 causes any signal condition effect on one transistor body of a paired access and drive transistor to be imposed on the other transistor body as well. Thus, the two transistors remain generally balanced with respect to one another. Consequently, noise immunity is improved and the transistors may properly perform the function of permitting a read as discussed above. This latter statement may indeed also be true of prior art configurations, but note that the preferred embodiment achieves the same goal without having to further connect the bodies of each transistor to a known potential such as to the source or to ground. As shown below, in addition to achieving this goal, the preferred embodiment may have further benefits in contrast to alternative configurations and the prior art, where such benefits include reduced current leakage, reduced capacitance imposed on bitlines and wordlines, and reduced device size.

The mutual body connections of storage cell SCI(0,0) of FIG. 3 may reduce transient current leakage relative to a condition where the body of the access transistor floats and is not connected to the body of any other transistor. Specifically, the preferred embodiment also avoids possible bipolar leakage which might occur if the body of the access transistor were left floating by itself. In this regard, note that the drain-to-body and body-to-source junctions of each access transistor effectively forms an NPN bipolar transistor (for an n-channel transistor). This is further appreciated from returning to FIG. 2b and noting that diodes D1 and D2 represent such an NPN configuration. Given this NPN configuration, note that a possible bipolar leakage situation occurs if the body of each access transistor is left to float by itself. By way of example, returning to access transistor AT4 in FIG. 3, assume by way of contrast that its body were left floating by itself (i.e., not connected to the body of drive transistor DT4). Next, assume at a first time that both of its source/drains $S/D_1$ and $S/D_2$ were at $V_{DD}$. At this time, therefore, the body of access transistor AT4, because it is floating, also would be at $V_{DD}$ or, indeed, possibly at a level approaching one diode voltage (0.6 volts) above $V_{DD}$. At a second time thereafter, assume that bitline $BL_{0b}$, which is connected to source/drain $S/D_1$, is pulled low toward ground. In response, and again since the body is floating by itself in the example, then the voltage change at source/drain $S/D_1$ from $V_{DD}$ to ground would also cause the same amount of voltage change (i.e., from $V_{DD}+0.6$ volts to ground+0.6 volts) to occur at the body. Looking to FIG. 2b, note that when this voltage change occurs there is a strong forward bias across the PN junction of diode D2, thereby causing a current to flow through it; additionally, because of the above-mentioned bipolar configuration, there is then current flowing through diode D1, and this current even may be amplified by the bipolar action. Having demonstrated this possible bipolar leakage current, note once again that the preferred embodiment avoids this effect. Particularly, in the same example as just reviewed, at the first time when both source/drains $S/D_1$ and $S/D_2$ are at $V_{DD}$, the body of access transistor AT4 is only approximately one diode voltage above ground (because it is connected to the body of drive transistor DT4 which has it source connected to ground). Consequently, at the second time when source/drain $S/D_1$ of access transistor AT4 is then pulled low, there is not nearly as large a forward biasing of diode D2 and, indeed, it may well be the case that the body voltage never reaches a point sufficient to forward bias diode D2. As a result, the possibility of bipolar leakage is substantially reduced if not eliminated entirely.

The mutual body connections of storage cell SCI(0,0) of FIG. 3 may reduce capacitance on bitlines $BL_{0a}$ and $BL_{0b}$ as well as wordline $WL_0$. Specifically, by allowing the bodies to float in the manner provided in storage cell SCI(0,0), the effective capacitance seen by the gate and drain is reduced. Thus, the floating body reduces the gate to body capacitance and thereby reduces the effective capacitance loading on wordline $WL_0$. Additionally, the floating body reduces the drain to body capacitance and thereby reduces the effective capacitance loading on bitlines $BL_{0a}$ and $BL_{0b}$.

Figure 4A:
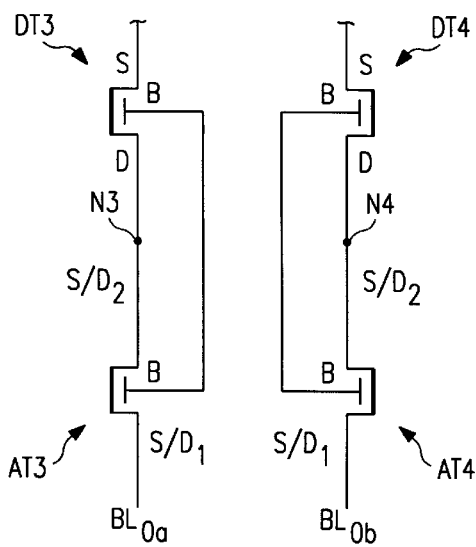
FIG. 4a illustrates a schematic of part of the schematic of FIG. 3, with various transistors connected in the same electrical manner but physically re-arranged to facilitate an appreciation of FIG. 4b.
Figure 4C:
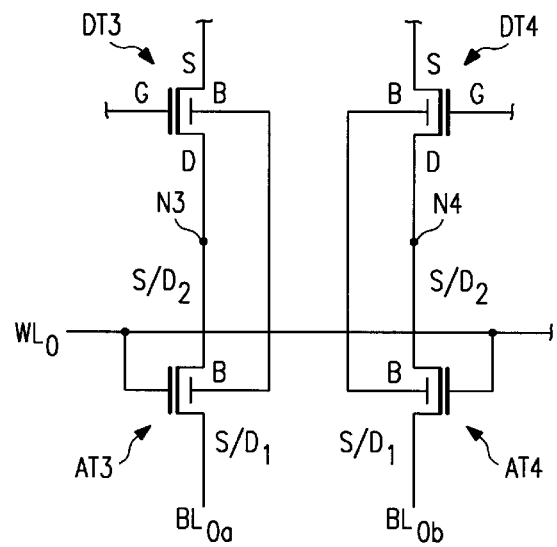
FIG. 4c illustrates the schematic of FIG. 4a after the transistor gates and a wordline are added.
Figure 4B:
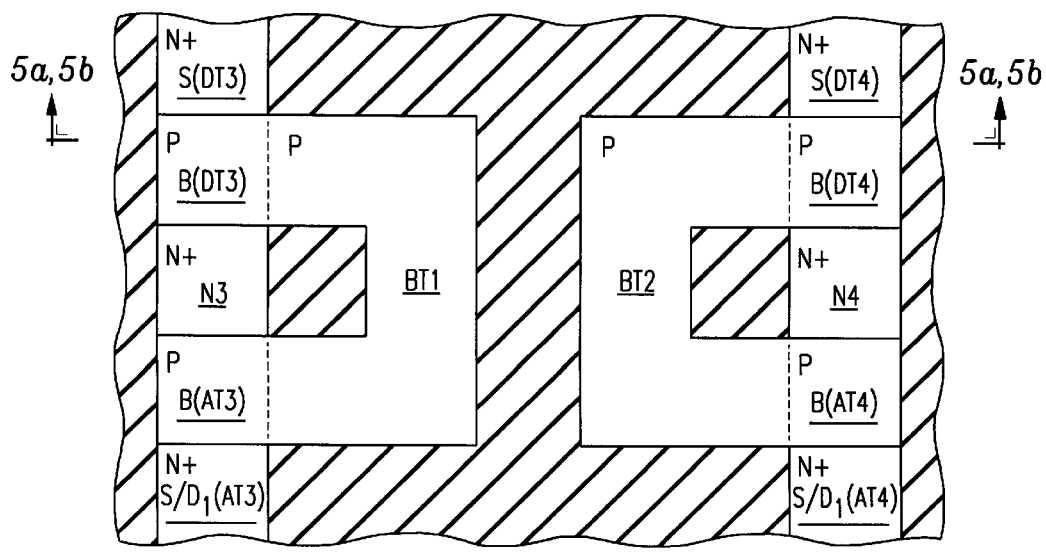
FIG. 4b illustrates a plan view of the semiconductor fabrication of a first embodiment of the transistors of FIG. 4a after the source, drain, body, and body tie regions are formed.

FIGS. 4a and 4b illustrate in schematic and layout form, respectively, some initial steps for implementing storage cell SCI(0,0). With brief reference to FIG. 4a, it shows drive transistors DT3 and DT4 and access transistors AT3 and AT4, but to simplify the corresponding illustration of FIG. 4b the schematic of FIG. 4a does not illustrate in detail the pull-up transistors, bitlines, and wordline discussed above. In an electrical connection sense, the schematic of FIG. 4a is identical to FIG. 3 to the extent that the same components are shown. However, in FIG. 4a, the components are physically rearranged to provide a basis to more easily appreciate FIG. 4b. Additionally, the gates of the transistors in FIG. 4a are not shown for reasons more apparent below. Turning to an introduction of FIG. 4b, it illustrates a plan view of a first embodiment of the integrated circuit layout of the transistors of FIG. 4a, with FIG. 4b illustrating the circuit after the source, drain, and body regions are formed for drive transistors DT3 and DT4 and access transistors AT3 and AT4, as well as two body tie regions BT1 and BT2 described below.

Looking now in more detail to FIG. 4b, in the area of its top left corner is an N+ region which forms the source S of drive transistor DT3; for the sake of better appreciating the reference identifiers in FIG. 4a, note that this source region is labeled with an "S" as in FIG. 4a, but a parenthetical is added to indicate that the source is of drive transistor DT3. This same convention is used for the remainder of this document. Continuing with FIG. 4b, a P type semiconductor region which forms the body B(DT3) of drive transistor DT3 separates source S(DT3) from node N3. From FIG. 4a, one skilled in the art will appreciate that node N3 represents both the drain of drive transistor DT3 as well as the second source/drain $S/D_2(AT3)$ of access transistor AT3. Continuing downward along the left of FIG. 4b, there is another P type semiconductor region which forms the body B(AT3) of access transistor AT3, and that body separates node N3 from the first source/drain $S/D_1(AT3)$ of access transistor AT3. Recall from FIGS. 3 and 4a that, in the preferred embodiment, the bodies of access transistor AT3 and drive transistor DT3 are electrically connected to one another. In this regard, note further that the semiconductor layer shown in FIG. 4b further includes a body tie BT1, also formed as a P type semiconductor region. Thus, one skilled in the art will appreciate that body tie BT1 provides an electrical connection between bodies B(DT3) and B(AT3) of transistors DT3 and AT3, respectively. Lastly, note that portions of the remaining illustrated area of FIG. 4b are shown with a thick cross-hatching to indicate an isolation technique using an insulator, typically formed as an oxide.

The illustration along the right of FIG. 4b is symmetric with respect to that described immediately above for the left of the Figure, with the exception that the right side of the Figure is directed to drive transistor DT4 and access transistor AT4. Thus, briefly reviewing the right side of the illustration and starting at the top right of FIG. 4b, there is an N+ region which forms the source S(DT4) of drive transistor DT4, and a P type semiconductor region which forms the body B(DT4) of drive transistor DT4 and separates source S(DT4) from node N4, where node N4 represents both the drain of drive transistor DT4 as well as the second source/drain $S/D_2(AT4)$ of access transistor AT4. Continuing downward along the right of FIG. 4b, there is another P type semiconductor region which forms the body B(AT4) of access transistor AT4, and that body separates node N4 from the first source/drain $S/D_1(AT4)$ of access transistor AT4. Lastly, the semiconductor layer shown in FIG. 4b further includes a body tie BT2, also formed as a P type semiconductor region, where body tie BT2 provides an electrical connection between bodies B(DT4) and B(AT4) of transistors DT4 and AT4, respectively.

Figure 4D:
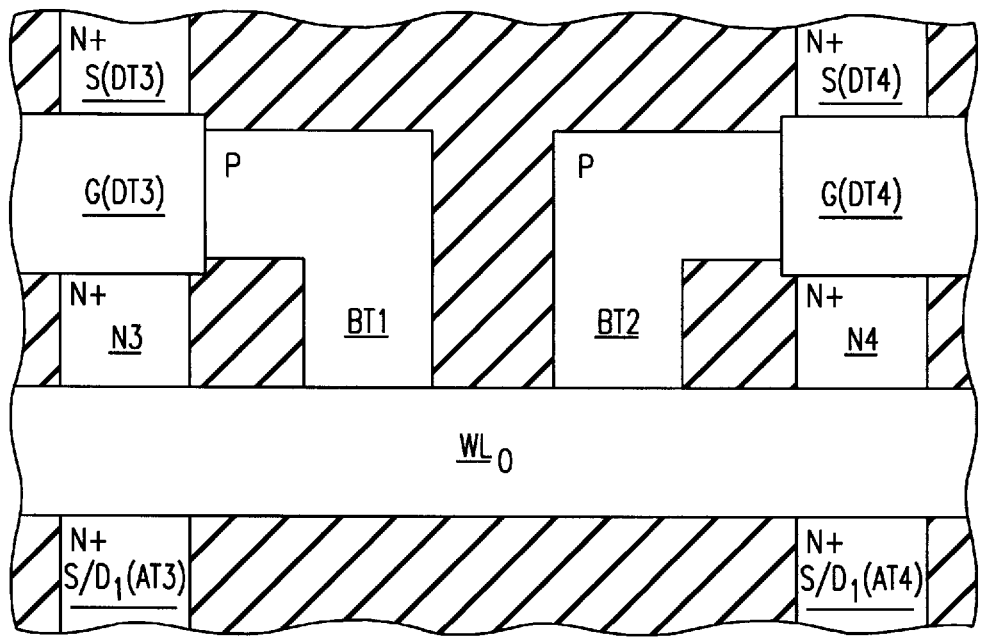
FIG. 4d illustrates a plan view of the semiconductor fabrication of the schematically represented embodiment of FIG. 4c.

FIGS. 4c and 4d illustrate in schematic and layout form, respectively, a subsequent step for implementing storage cell SCI(0,0). With brief reference to FIG. 4c, it shows the schematic of FIG. 4a, with the addition of the gates to the illustrated transistors and the addition of wordline $WL_0$. Turning now to FIG. 4d, gate G(DT3) is added for drive transistor DT3 and gate G(DT4) is added for drive transistor DT4. Each gate conductor is generally perpendicular to the dimension formed by the source and drain region of the drive transistors, and note that each gate conductor is preferably slightly wider than the width of each body tie BT1 and BT2 in the dimension shown horizontally in FIG. 4d. This additional width is beneficial in case a metal layer is subsequently formed over the semiconductor regions in that the extra width may prevent a short circuit which might otherwise form between a body tie and one of the sources or drains of drive transistor DT4 or DT5. Concluding FIG. 4d, wordline $WL_0$ is formed by a continuous conductor in the horizontal dimension and overlying the bodies of each of access transistors AT3 and AT4 (and other additional access transistors which, while not shown, may be formed in the same row as access transistors AT3 and AT4).

Figure 5A:
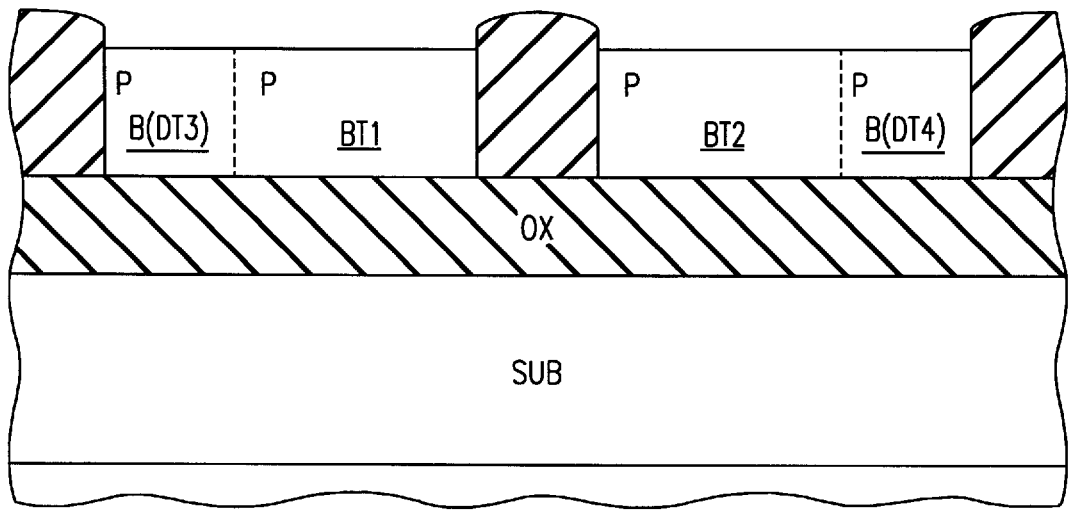
FIG. 5a illustrates a first cross-sectional view which may appear along line 5a,5b—5a,5b shown in the plan view of FIG. 4b.

FIG. 5a is a first cross-sectional view taken along line 5a,5b—5a,5b of FIG. 4b. Thus, FIG. 5a illustrates body B(DT3) of drive transistor DT3 and body B(DT4) of drive transistor DT4. Additionally, FIG. 5a demonstrates a cross-section of each of body ties BT1 and BT2. From the perspective of FIG. 5a, note further that in this embodiment the height of the device layer which forms bodies B(DT3) and B(DT4) as well as body ties BT1 and BT2 is uniform. In other words, each of these device parts extend the same distance perpendicular to the surfaces of the oxide layer OX and substrate SUB formed below them. Additionally, although not shown in the perspective of FIG. 5a, note also that in the present embodiment that this same height of body ties BT1 and BT2 is also the height of the source and drain regions of each of access transistors AT3 and AT4 as well as that of the source and drain regions of each of the drive transistors DT3 and DT4. This height feature is noted as it differs from an alternative embodiment which is also within the inventive scope and is discussed immediately below.

Figure 5B:
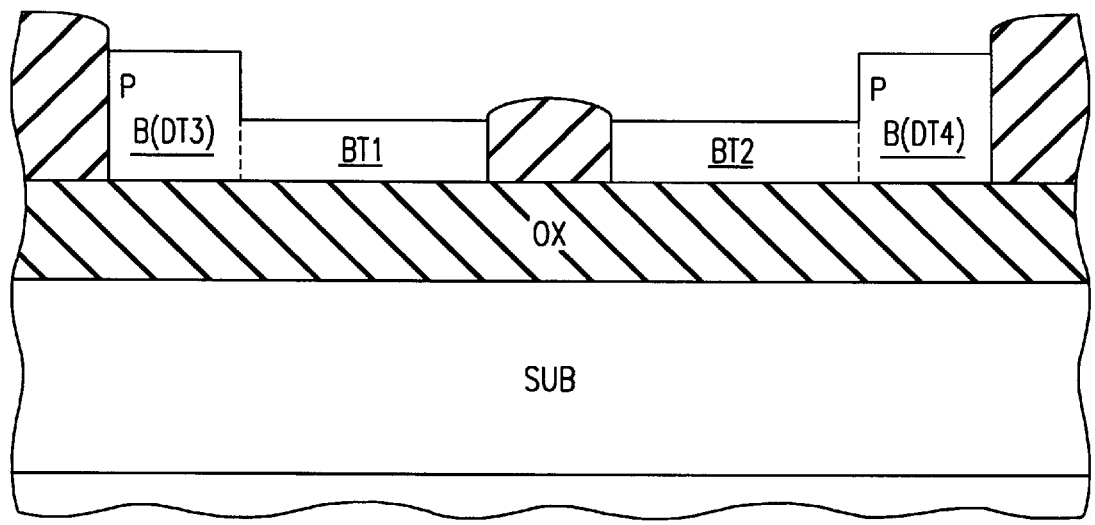
FIG. 5b illustrates a second cross-sectional view which may appear along line 5a,5b—5a,5b shown in the plan view of FIG. 4b.

FIG. 5b is also a cross-sectional view taken along line 5a,5b—5a,5b of FIG. 4b, but demonstrates an alternative manner of constructing body ties BT1 and BT2. With respect to body B(DT3) of drive transistor DT3 and body B(DT4) of drive transistor DT4, they are unchanged from the embodiment shown in FIG. 5a. However, FIG. 5b demonstrates an alternative formation of each of body ties BT1 and BT2. Specifically, from the perspective of FIG. 5b, note that in this embodiment the height of the device layer which forms bodies B(DT3) and B(DT4) as well as body ties BT1 and BT2 is not uniform. Instead, note that body ties BT1 and BT2 do not extend to the same height as the remaining device layer regions of transistors DT3 and DT4. In other words, recall from FIG. 5a that the earlier embodiment included body ties which extend a height, as defined in the dimension perpendicular to the surfaces of oxide layer OX and substrate SUB, equal to the height of bodies B(DT3) and B(DT4) (as well as the height of the source and drain regions of access transistors AT3 and AT4). In contrast, in the embodiment of FIG. 5b, the height of body ties BT1 and BT2 is reduced. In this regard, note that this reduced height technique may be achieved as has been done by IBM in devices where a reduced height structure joins the bodies of many or all SOI transistors in an area on an integrated circuit analogous to a well structure in bulk. Such well-like structures in SOI generally incur increased capacitance and increased junction leakage, as well as otherwise restricting the layout of the transistors. However, in the present embodiment, it is contemplated that only the body of drive transistor DT3 is connected to the body of access transistor AT3 and that the body of drive transistor DT4 is connected to the body of access transistor AT4. This selective connection of body nodes can generally be accomplished with less capacitance and less junction area than for a well-like connection of all body nodes in an area. Further, the well-like connection is generally tied to a known potential, usually $V_{DD}$ or $V_{SS}$. In stark contrast, the body connection of transistors AT3 and DT3, and AT4 and DT4, are only between the paired transistors, and thus the bodies are permitted to float together.

Figure 6:
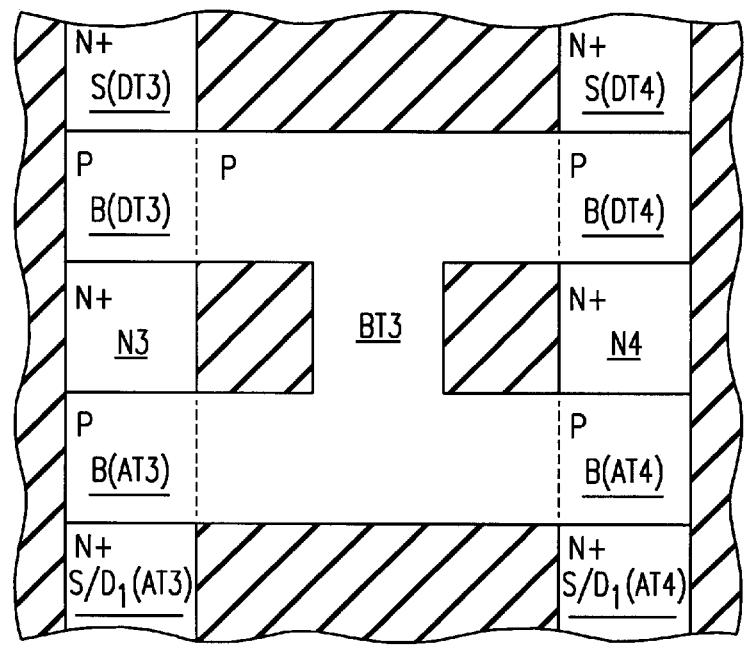
FIG. 6 illustrates a plan view of the semiconductor fabrication of a second embodiment of the transistors of FIG. 4a after the source, drain, body, and body tie regions are formed.

FIG. 6 illustrates an alternative embodiment of storage cell SCI(0,0) shown in FIG. 4b, with the difference in FIG. 6 being a different formation of a body tie designated BT3. By comparing FIGS. 6 and 4b, one skilled in the art will appreciate that body tie BT3 in FIG. 6 connects the body of drive transistor DT3 to the body of access transistor AT3 as does body tie BT1 in FIG. 4b, and also connects the body of drive transistor DT4 and access transistor AT4 as does body tie BT2 in FIG. 4b. However, note further that body tie BT3 is a single structure rather than the separate connections of body ties BT1 and BT2. Thus, electrically speaking, body tie BT3 further connects the bodies of drive transistor DT3 and access transistor AT3 to the bodies of drive transistor DT4 and access transistor AT4. After the structure of FIG. 6 is complete, the remaining illustrations of FIGS. 4b, 5a, and 5b may then be applied to complete the storage cell.

The alternative embodiment of FIG. 6 provides both advantages and disadvantages. As a first advantage, the embodiment of FIG. 6 may further reduce the overall layout of the full memory cell by eliminating the separate width of both body ties BT1 and BT2. Note, however, that in alternative situations an attempt to connect all the bodies connected by body tie BT3 may either increase area or complicate the device configuration. As a second advantage, the embodiment of FIG. 6 further increases noise margin because it provides symmetry between the threshold voltages of drive transistors DT3 and DT4. This could be a further factor in increasing resistance to upset by an ion strike, where an ion may strike the body of one drive transistor but not the other. Lastly, as a possible disadvantage as compared to earlier embodiments, note that the separate connections of body ties BT1 and BT2 provide separate couplings between gate and body which tends to reduce the threshold voltage of on transistors and lower the threshold voltage of off transistors. The use of a combined body tie BT3, however, does not provide this effect.

From the above, it may be appreciated that the above embodiments provide an improved memory cell configuration over the prior art. Additionally, while the present embodiments have been described in detail, various substitutions, modifications or alterations could be made to the descriptions set forth above without departing from the inventive scope. Some of these examples are discussed above, while still others will be ascertainable by one skilled in the art. Indeed, as a few examples, note that the conductivity types of the transistors described herein may be reversed. As another example, while a 6T cell has been described above, note that it is presented by way of example. Thus, other memory cells may also implement the present inventive teachings. For example, a 4T-2R cell also includes two access transistors, each connected such that when a corresponding drive transistor operates during some read operations, a series conductive path is formed through both it and the corresponding drive transistor to pull down a corresponding bitline. Thus, in this cell the bodies of the corresponding access and drive transistors may to float together and otherwise float in accordance with the inventive scope. As another example, while the embodiments of FIGS. 5a and 5b illustrate various types of layouts for connecting the bodies of the subject transistors, other layouts also may be used to achieve access and drive transistors with tied and floating bodies. As still another example, while FIG. 1 illustrates only a single memory bank, the teachings of this document may apply to other multiple or alternative memory configurations as well. As yet another example, while the preceding illustrations are implemented in a memory configuration, still other embodiments may be constructed where there are two transistors each having a different function (e.g., in a flip flop or a latch), where the bodies of the transistors are connected to one another but otherwise float in that they are not further connected to a fixed potential, and the balancing of body potentials due to such a connection provides improved operation or device size characteristics. Still other examples may be ascertained by one skilled in the art. Thus, these examples as well as the preceding teachings further demonstrate the flexibility and considerations of the inventive scope, as defined by the following claims.

We claim:

1. An integrated circuit comprising:
   a first SOI transistor having a body and for performing first function;
   a second SOI transistor having a body and for performing a second function different than the first function;
   a conductor connecting the body of the first SOI transistor to the body of the second SOI transistor such that the bodies of the first SOI transistor and the second SOI transistor float together.

2. The integrated circuit of claim 1 wherein the first SOI transistor is an access transistor in a memory cell.

3. The integrated circuit of claim 1 wherein the first SOI transistor is a drive transistor in a memory cell.

4. The integrated circuit of claim 1:
   wherein the first SOI transistor is an access transistor in a memory cell; and
   wherein the second SOI transistor is a drive access transistor in the memory cell.

5. The integrated circuit of claim 4:
   wherein the access transistor comprises a plurality of nodes comprising a first source/drain, a second source/drain, and a gate for receiving a potential to enable a conductive path between the first source/drain and the second source/drain;
   wherein the drive transistor comprises a plurality of nodes comprising a first source/drain, a second source/drain, and a gate for receiving a potential to enable a conductive path between the first source/drain and the second source/drain; and
   wherein the conductive path of the access transistor is coupled to the conductive path of the pass transistor.

6. The integrated circuit of claim 4:
   wherein the access transistor comprises a first access transistor;
   wherein the drive transistor comprises a first drive transistor; and
   wherein the conductor comprises a first conductor;
   and further comprising:
      a second SOI access transistor having a body;
      a second SOI drive transistor having a body; and
      a second conductor connecting the body of the second SOI access transistor to the body of the second SOI drive transistor such that the bodies of the second SOI access transistor and the second SOI drive transistor float together.

7. The integrated circuit of claim 6 wherein the first conductor and the second conductor are electrically connected to one another.

8. The integrated circuit of claim 1:
   and further comprising a plurality of memory cells, wherein one of the plurality of memory cells includes the first SOI transistor as an access transistor and the second SOI transistor as a drive transistor; and
   wherein each of the plurality of memory cells other than the one of the plurality of memory cells comprises:
      an SOI access transistor having a body;
      an SOI drive transistor having a body; and
      a conductor connecting the body of the SOI access transistor to the body of the SOI drive transistor such that the bodies of the SOI access transistor and the SOI drive transistor float together.

9. The integrated circuit of claim 8:
   wherein for each of the plurality of memory cells other than the one of the plurality of memory cells:
      the access transistor comprises a first access transistor;
      the drive transistor comprises a first drive transistor; and
      the conductor comprises a first conductor;
   and wherein each of the plurality of memory cells other than the one of the plurality of memory cells further comprises:
      a second SOI access transistor having a body;
      a second SOI drive transistor having a body; and
      a second conductor connecting the body of the second SOI access transistor to the body of the second SOI drive transistor such that the bodies of the second SOI access transistor and the second SOI drive transistor float together.

10. An integrated circuit comprising a memory array, wherein the memory array comprises:
    a first bitline; and
    a plurality of memory storage cells, wherein each of the plurality of memory cells comprises:
       a first SOI access transistor comprising a plurality of nodes, the plurality of nodes comprising a first source/drain, a second source/drain, a gate for receiving a potential to enable a conductive path between the first source/drain and the second source/drain, and a body terminal coupled to a body region disposed between the first source/drain and the second source/drain, wherein the first source/drain of the first SOI access transistor is coupled to the first bitline;
       a first SOI drive transistor comprising a plurality of nodes, the plurality of nodes comprising a first source/drain, a second source/drain, a gate for receiving a potential to enable a conductive path between the first source/drain and the second source/drain, and a body terminal coupled to a body region disposed between the first source/drain and the second source/drain, wherein the first source/drain of the first SOI drive transistor is coupled to the second source/drain of the first SOI access transistor; and a body connection coupling the body of the first SOI access transistor to the body of the first SOI drive transistor such the bodies of the first SOI access transistor and the first SOI drive transistor are connected to float together.

11. The integrated circuit of claim 10:

wherein the first bitline is operable to be precharged to a potential equal to a first voltage;

wherein the second source/drain of the first SOI drive transistor is coupled to receive a second voltage different than the first voltage; and wherein the first SOI access transistor and first SOI drive transistors are operable to concurrently conduct such that the potential of the first bitline changes from the first voltage toward the second voltage.

12. The integrated circuit of claim 10 wherein each of the first SOI access transistor and the first SOI drive transistors is an n-channel transistor.

13. The integrated circuit of claim 10 and further comprising a second bitline, and wherein each of the plurality of memory storage cells further comprises:

a second SOI access transistor comprising a plurality of nodes, the plurality of nodes comprising a first source/drain, a second source/drain, a gate for receiving a potential to enable a conductive path between the first source/drain and the second source/drain, and a body terminal coupled to a body region disposed between the first source/drain and the second source/drain, wherein the first source/drain of the second SOI access transistor is coupled to the second bitline;

a second SOI drive transistor comprising a plurality of nodes, the plurality of nodes comprising a first source/drain, a second source/drain, a gate for receiving a potential to enable a conductive path between the first source/drain and the second source/drain, and a body terminal coupled to a body region disposed between the first source/drain and the second source/drain, wherein the first source/drain of the second SOI drive transistor is coupled to the second source/drain of the second SOI access transistor; and a body connection coupling the body of the second SOI access transistor to the body of the second SOI drive transistor such the bodies of the second SOI access transistor and the second SOI drive transistor are connected to float together.

14. The integrated circuit of claim 13 wherein the a body connection coupling the body of the first SOI access transistor to the body of the first SOI drive transistor is electrically connected to the body connection coupling the body of the second SOI access transistor to the body of the second SOI drive transistor.

15. The integrated circuit of claim 13:

wherein the second bitline is operable to be precharged to a potential equal to a first voltage;

wherein the second source/drain of the second SOI drive transistor is coupled to a second voltage different than the first voltage; and wherein the second SOI access transistor and second SOI drive transistors are operable to concurrently conduct such that the potential of the second bitline changes from the first voltage toward the second voltage.

16. The integrated circuit of claim 13 wherein each of the second SOI access transistor and the second SOI drive transistors is an n-channel transistor.

17. The integrated circuit of claim 13 wherein each of the plurality of memory cells further comprises:

a first SOI pull-up transistor comprising a plurality of nodes, the plurality of nodes comprising a first source/drain, a second source/drain, a gate for receiving a potential to enable a conductive path between the first source/drain and the second source/drain;

wherein the first source/drain of the first SOI pull-up transistor is coupled to receive a reference potential;

wherein the second source/drain of the first SOI pull-up transistor is coupled to the second source/drain of the first SOI access transistor; and wherein the gate of the first SOI pull-up transistor is coupled to the gate of the first SOI access transistor; and a second SOI pull-up transistor comprising a plurality of nodes, the plurality of nodes comprising a first source/drain, a second source/drain, a gate for receiving a potential to enable a conductive path between the first source/drain and the second source/drain;

wherein the first source/drain of the second SOI pull-up transistor is coupled to the reference potential;

wherein the second source/drain of the second SOI pull-up transistor is coupled to the second source/drain of the second SOI access transistor; and wherein the gate of the second SOI pull-up transistor is coupled to the gate of the second SOI access transistor.

18. The integrated circuit of claim 17:

wherein each of the first SOI access transistor, the first SOI drive transistor, the second SOI access transistor, and the second SOI drive transistor is of a first conductivity type; and wherein each of the first SOI pull-up transistor and the second SOI pull-up transistor is of a second conductivity type different than the first conductivity type.

19. The integrated circuit of claim 13 wherein each of the second SOI access transistor and the second SOI drive transistors is an n-channel transistor.

20. The integrated circuit of claim 10 wherein each of the plurality of memory storage cells is a static random access memory storage cell.

21. The integrated circuit of claim 10 wherein the integrated circuit is part of a stand alone memory integrated circuit comprising the plurality of memory storage cells.

22. The integrated circuit of claim 10 wherein the integrated circuit is part of an application specific integrated circuit comprising the plurality of memory storage cells.

23. The integrated circuit of claim 10 wherein the integrated circuit is part of a digital signal processor comprising the plurality of memory storage cells.

24. The integrated circuit of claim 10 wherein the memory configuration is part of a microprocessor comprising the plurality of memory storage cells.

25. The integrated circuit of claim 10 wherein each of the plurality of memory cells further comprises:

a first SOI pull-up transistor comprising a plurality of nodes, the plurality of nodes comprising a first source/drain, a second source/drain, a gate for receiving a potential to enable a conductive path between the first source/drain and the second source/drain;

wherein the first source/drain of the first SOI pull-up transistor is coupled to a reference potential;

wherein the second source/drain of the first SOI pull-up transistor is coupled to the second source/drain of the first SOI access transistor; and wherein the gate of the first SOI pull-up transistor is coupled to the gate of the first SOI access transistor.

26. The integrated circuit of claim 25:

wherein each of the first SOI access transistor and the first SOI drive transistor is of a first conductivity type; and wherein the first SOI pull-up transistor is of a second conductivity type different than the first conductivity type.

27. The integrated circuit of claim 10 wherein the memory array further comprises:

a plurality of wordlines;

a plurality of bitlines including the first bitline, wherein the plurality of bitlines are paired such that a first bitline in a bitline pair is associated with a second bitline in the bitline pair;

a group of memory storage cells including the plurality of memory storage cells, wherein each of the group of memory cells comprises:

a first SOI access transistor comprising a plurality of nodes, the plurality of nodes comprising a first source/drain, a second source/drain, a gate for receiving from one of the plurality of wordlines a potential to enable a conductive path between the first source/drain and the second source/drain, and a body terminal coupled to a body region disposed between the first source/drain and the second source/drain, wherein the first source/drain of the first SOI access transistor is coupled to the first bitline in a bitline pair;

a first SOI drive transistor comprising a plurality of nodes, the plurality of nodes comprising a first source/drain, a second source/drain, a gate for receiving a potential to enable a conductive path between the first source/drain and the second source/drain, and a body terminal coupled to a body region disposed between the first source/drain and the second source/drain, wherein the first source/drain of the first SOI drive transistor in a given memory cell is coupled to the second source/drain of the first SOI access transistor for the corresponding given memory cell;

a first body connection coupling the body of the first SOI access transistor in a given memory cell to the body of the first SOI drive transistor for the corresponding given memory cell such the bodies of the first SOI access transistor and the first SOI drive transistor for the corresponding given memory cell are connected to float together;

a second SOI access transistor comprising a plurality of nodes, the plurality of nodes comprising a first source/drain, a second source/drain, a gate for receiving from the one of the plurality of wordlines a potential to enable a conductive path between the first source/drain and the second source/drain, and a body terminal coupled to a body region disposed between the first source/drain and the second source/drain, wherein the first source/drain of the second SOI access transistor is coupled to the second bitline in the bitline pair;

a second SOI drive transistor comprising a plurality of nodes, the plurality of nodes comprising a first source/drain, a second source/drain, a gate for receiving a potential to enable a conductive path between the first source/drain and the second source/drain, and a body terminal coupled to a body region disposed between the first source/drain and the second source/drain, wherein the first source/drain of the second SOI drive transistor in the given memory cell is coupled to the second source/drain of the second SOI access transistor for the corresponding given memory cell; and a second body connection coupling the body of the second SOI access transistor in the given memory cell to the body of the second SOI drive transistor for the corresponding given memory cell such the bodies of the second SOI access transistor and the second SOI drive transistor for the corresponding given memory cell are connected to float together.

28. The integrated circuit of claim 27 wherein the first body connection is connected to the second body connection.

* * * * *